(12) United States Patent
Lee et al.

(10) Patent No.: US 8,986,561 B2
(45) Date of Patent: Mar. 24, 2015

(54) SUBSTRATE PROCESSING METHOD AND STORAGE MEDIUM

(75) Inventors: Sungtae Lee, Nirasaki (JP); Masahiro Ogasawara, Nirasaki (JP); Masahiro Ito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1126 days.

(21) Appl. No.: 12/646,142

(22) Filed: Dec. 23, 2009

(65) Prior Publication Data
US 2010/0163525 A1   Jul. 1, 2010

Related U.S. Application Data

(60) Provisional application No. 61/238,247, filed on Aug. 31, 2009.

(30) Foreign Application Priority Data

Dec. 26, 2008  (JP) .................................. 2008-332375
Jul. 6, 2009    (JP) .................................. 2009-159849

(51) Int. Cl.
*C03C 15/00*  (2006.01)
*H01L 21/311* (2006.01)

(52) U.S. Cl.
CPC .... *H01L 21/31138* (2013.01); *H01L 21/31116* (2013.01); *H01L 21/31122* (2013.01); *H01L 21/31144* (2013.01)
USPC .................... 216/41; 216/49; 216/63; 216/67

(58) Field of Classification Search
USPC ........................................................ 216/41
See application file for complete search history.

(56) References Cited

U.S. PATENT DOCUMENTS

| | | | | |
|---|---|---|---|---|
| 2,927,138 | A | * | 3/1960 | Wall et al. ...................... 570/146 |
| 5,376,228 | A | * | 12/1994 | Yanagida ....................... 438/714 |
| 6,388,039 | B1 | * | 5/2002 | Jung et al. ................... 526/329.6 |
| 6,475,918 | B1 | | 11/2002 | Izawa et al. |
| 6,635,185 | B2 | * | 10/2003 | Demmin et al. ................ 216/64 |
| 2002/0090812 | A1 | * | 7/2002 | Chang ........................... 438/637 |

(Continued)

FOREIGN PATENT DOCUMENTS

| | | |
|---|---|---|
| CN | 1787176 A | 6/2006 |
| CN | 1924697 A | 3/2007 |

(Continued)

OTHER PUBLICATIONS

CRC, CRC Handbook of Chemistry and Physics, 1980, CRC Press, 60th Edition, p. B-51 through B-52.*

(Continued)

*Primary Examiner* — Binh X Tran
*Assistant Examiner* — David Cathey, Jr.
(74) *Attorney, Agent, or Firm* — Rothwell, Figg, Ernst & Manbeck, P.C.

(57) ABSTRACT

Disclosed is a substrate processing method of etching a substrate including a target layer, and a mask layer and an intermediate layer that are stacked on the target layer, to form a pattern on the target layer via the intermediate layer and the mask layer. The intermediate layer is etched under a processing pressure of 100 mTorr (1.33×10 Pa) to 150 mTorr (2.0×10 Pa) by using as a processing gas a mixture gas of $CF_4$, $CHF_3$, and $C_4F_8$, and the mask layer is etched by using a COS-containing gas as a processing gas.

33 Claims, 7 Drawing Sheets

(56) References Cited

U.S. PATENT DOCUMENTS

| | | |
|---|---|---|
| 2006/0051968 A1* | 3/2006 | Joshi et al. .................... 438/723 |
| 2007/0197040 A1* | 8/2007 | Kitamura et al. ............. 438/710 |
| 2009/0047789 A1* | 2/2009 | Jung ............................. 438/694 |

FOREIGN PATENT DOCUMENTS

| | | | |
|---|---|---|---|
| CN | 101285189 A | | 10/2008 |
| JP | 7-74147 A | | 3/1995 |
| JP | 10-242127 | | 9/1998 |
| JP | 2001-110784 | | 4/2001 |
| JP | 2003-298049 A | | 10/2003 |
| JP | 2004-119539 | | 4/2004 |
| JP | 2007-294943 A | | 11/2007 |
| JP | 2008-172184 A | | 7/2008 |

OTHER PUBLICATIONS

Rack, Plasma Etching, 2004, University of Tennesse, 2 pages include date page.*

Shouliang Lai, Chapter 12 Plasma Etching (brochure for semiconductor integrated circuit manufacturers, Unaxis USA, Inc., St. Petersburg, FL) (w/ English translation) (55 pages).

* cited by examiner

SUBSTRATE PROCESSING METHOD AND STORAGE MEDIUM

FIELD OF THE INVENTION

The present invention relates to a substrate processing method and a storage medium, and particularly to a substrate processing method for etching a target layer while protecting a mask layer.

BACKGROUND OF THE INVENTION

A wafer for a semiconductor device has been known that includes a silicon base, an oxide layer stacked on the silicon base, a lower resist layer formed on the oxide layer of an organic layer, and a bottom antireflective coating layer ("BARC layer") formed on the lower resist layer. In particular, the lower resist layer serves as a mask when the oxide layer is etched.

As the size of a semiconductor device recently decreases, it is required to more finely form a circuit pattern on the surface of a wafer.

To form such a fine circuit pattern on the wafer, it is needed to precisely transcribe a small size of opening portion (hole or trench) to the target layer, i.e., oxide layer, as well as to make the minimum size of the pattern smaller in the lower resist layer serving as a mask layer in manufacturing the semiconductor device.

The opening dimension of hole or trench (hereinafter, simply referred to as "hole") becomes smaller and an aspect ratio thereof becomes greater, while the thickness of the mask layer tends to be thin. This may cause striations at the top portion of the hole and distortions at the bottom portion. In the meanwhile, since mask layer of a sufficient thickness cannot be secured upon etching, a bowing shape (swollen or expanded shape) may occur at the cross section of the hole formed in the target layer. These may deteriorate the throughput of semiconductor devices.

Conventionally, Japanese Patent Application Publication Nos. 2004-119539 and 2001-110784 disclose a technology to prevent hole shape from being deformed or distorted.

Japanese Patent Application Publication No. 2004-119539 is directed to preventing exposure of side walls of a pattern-etched dielectric film to $O_2$ plasma and discloses an ashing method of a resist pattern that includes removing a resist pattern employed as a mask layer in the pattern etching of an interlayer dielectric by an ashing process through the supply of $O_2$ plasma, wherein the ashing process is performed while the supply of carbon and $O_2$ plasma is performed at the same time.

Japanese Patent Application Publication No. 2001-110784 is directed to an etching method of obtaining a vertical fabricated shape having less bowing when a dielectric layer is processed in manufacturing a semiconductor device wherein the incident amount of O, F, or N radicals excessive at the beginning of etching is adjusted or suppressed by controlling the gas flow rate or the amount of O, F, and N consumed at inner walls together with the etching time, to thereby obtain a stable etching shape.

However, the above-mentioned prior arts focus on making even the top shape of the hole formed in the target layer, and thus fail to show a satisfactory result in removing a distortion of the cross section of the hole. Moreover, it is also unsatisfactory to suppress occurrence of a bowing at the cross section of the hole.

SUMMARY OF THE INVENTION

The present invention provides a substrate processing method and a storage medium capable of forming a good vertical shaped hole with an even top portion and a bottom portion without any distortion in a target layer. Further, the present invention provides a substrate processing method and a storage medium capable of preventing occurrence of a bowing shape when a side wall of the hole is partially expanded to thereby form a good vertical shaped hole in a target layer.

In accordance with a first aspect of the invention, there is provided a substrate processing method of etching a substrate including a target layer, and a mask layer and an intermediate layer that are stacked on the target layer, to form a pattern on the target layer via the intermediate layer and the mask layer, the method including: etching the intermediate layer under a processing pressure of about 100 mTorr (1.33×10 Pa) to 150 mTorr (2.0×10 Pa) by using as a processing gas a mixture gas of $CF_4$ gas, $CHF_3$ gas, and $C_4F_8$ gas; and etching the mask layer by using a COS-containing gas as a processing gas.

In accordance with a second aspect of the invention, there is provided a substrate processing method of etching a substrate including a target layer, and a mask layer and an intermediate layer that are stacked on the target layer, to form a pattern on the target layer via the intermediate layer and the mask layer, the method including: etching the target layer by using a $C_6F_6$-containing gas as a processing gas.

In accordance with a third aspect of the invention, there is provided A substrate processing method of etching a substrate including a target layer, and a mask layer and an intermediate layer that are stacked on the target layer, to form a pattern on the target layer via the intermediate layer and the mask layer, the method including: etching the target layer, said etching including, a primary etching using a $C_4F_6$-containing gas as a processing gas, and a secondary etching using a mixture gas of the $C_4F_6$-containing gas and a COS gas.

In accordance with a fourth aspect of the invention, there is provided a substrate processing method of etching a substrate including a target layer, and a mask layer and an intermediate layer that are stacked on the target layer, to form a pattern on the target layer via the intermediate layer and the mask layer, the method including: etching the intermediate layer under a processing pressure of about 100 mTorr (1.33×10 Pa) to 150 mTorr (2.0×10 Pa) by using as a processing gas a mixture gas of $CF_4$ gas, $CHF_3$ gas, and $C_4F_8$ gas; etching the mask layer by using a COS-containing gas as a processing gas; and etching the target layer by using a $C_6F_6$-containing gas as a processing gas.

In accordance with a fifth aspect of the invention, there is provided a substrate processing method of etching a substrate including a target layer, and a mask layer and an intermediate layer that are stacked on the target layer, to form a pattern on the target layer via the intermediate layer and the mask layer, the method including: etching the intermediate layer under a processing pressure of about 100 mTorr (1.33×10 Pa) to 150 mTorr (2.0×10 Pa) by using as a processing gas a mixture gas of $CF_4$, $CHF_3$, and $C_4F_8$; etching the mask layer by using a COS-containing gas as a processing gas; and etching the target layer, which includes: a primary etching using a $C_4F_6$-containing gas as a processing gas, and a secondary etching using a mixture gas of the $C_4F_6$-containing gas and a COS gas.

In accordance with a sixth aspect of the invention, there is provided a storage medium storing a program for executing on a computer a substrate processing method of etching a substrate including a target layer, and a mask layer and an intermediate layer that are stacked on the target layer, to form a pattern on the target layer via the intermediate layer and the mask layer, the substrate processing method including: etching the intermediate layer under a processing pressure of about 100 mTorr (1.33×10 Pa) to 150 mTorr (2.0×10 Pa) by using as a processing gas a mixture gas of $CF_4$ gas, $CHF_3$ gas, and $C_4F_8$ gas; etching the mask layer by using a COS-containing gas as a processing gas; and etching the target layer by using a $C_6F_6$-containing gas as a processing gas.

In accordance with a seventh aspect of the invention, there is provided a storage medium storing a program for executing on a computer a substrate processing method of etching a substrate including a target layer, and a mask layer and an intermediate layer that are stacked on the target layer, to form a pattern on the target layer via the intermediate layer and the mask layer, the substrate processing method including: etching the intermediate layer under a processing pressure of about 100 mTorr (1.33×10 Pa) to 150 mTorr (2.0×10 Pa) by using as a processing gas a mixture gas of $CF_4$ gas, $CHF_3$ gas, and $C_4F_8$ gas; etching the mask layer by using a COS-containing gas as a processing gas; and etching the target layer, which includes: a primary etching using a $C_4F_6$-containing gas as a processing gas, and a secondary etching using a mixture gas of the $C_4F_6$-containing gas and a COS gas.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in greater detail with reference of accompanying drawings.

First of all, there will be described a substrate processing system for performing a substrate processing method according to embodiments of the present invention. The substrate processing system includes a plurality of processing modules, each of which performs an etching process on a semiconductor wafer W (hereinafter, simply referred to as "wafer W") as a substrate by using a plasma.

Figure 1:
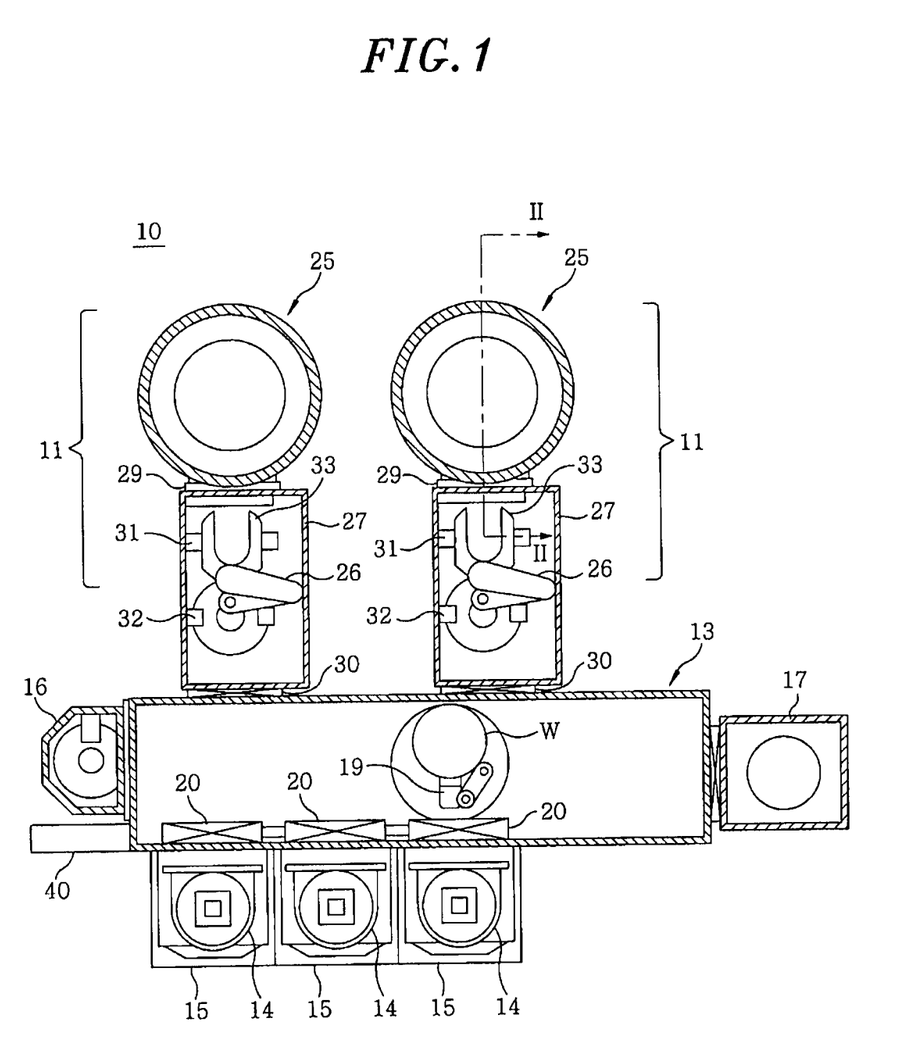
FIG. 1 is a plan view schematically illustrating a configuration of a substrate processing system that performs a substrate processing method according to an embodiment of the present invention.

FIG. 1 is a plan view schematically illustrating a configuration of a substrate processing system that performs a substrate processing method according to the embodiment of the present invention.

Referring to FIG. 1, the substrate processing system includes two process ships 11 and a waiting transfer chamber 13 (hereinafter, referred to as "loader module"). Each process ship functions as a substrate processing apparatus to perform an RIE (Reaction Ion Etching) process on a wafer W as a target substrate. The two process ships 11 are connected to the loader module 13. The loader module 13 has a substantially rectangular shape in section and serves as a common transfer chamber.

Besides the process ships 11, three FOUP (Front Opening portion Unified Pod) mounting tables 15, an orienter 16, and an after-treatment chamber 17 are connected to the loader module 13 as well. A FOUP 14, which is a substrate receiving vessel for receiving, e.g., 25 wafers W therein, is mounted in each FOUP mounting table 15. The orienter 16 pre-aligns the position of the wafer W unloaded from the FOUP 14. The after-treatment chamber 17 performs an after-treatment on the wafer that has been subjected to the RIE process.

The two process ships 11 are connected to a lengthwise side wall of the loader module 13, and the three FOUP mounting tables 15 are connected to the other lengthwise wall of the loader module 13, with the loader module 13 located between the process ships 11 and the FOUP mounting tables 15. The orienter 16 is disposed at a longitudinal end portion of the loader module 13 and the after-treatment chamber 17 is disposed at the other longitudinal end portion of the loader module 13.

The loader module 13 includes a SCARA type dual-arm transfer arm 19 and three load ports 20. The transfer arm serves as a substrate transfer unit that transfers a wafer W disposed in the loader module 13. The load ports 20 are disposed on the sidewall correspondingly to the respective FOUP mounting tables 15. Each load port 20 includes an opening/closing door. The transfer arm 19 takes out the wafer W from the FOUP 14 mounted on the FOUP mounting table 15 via the loading port 20 and transfers the taken wafer W between the loader module 13 and the process ship 11, the orienter 16 or the after-treatment chamber 17.

The process ship 11 includes a process module 25 and a load-lock module 27. The process module 25 serves as a vacuum process chamber that performs the RIE process on the wafer W. The load-lock module 27 includes a link-shaped single pick type transfer arm 26 for transferring the wafer W to the process module 25.

The process module 25 includes a cylindrical processing vessel (hereinafter, referred to as "chamber"), and an upper electrode and a lower electrode arranged in the chamber, wherein the distance between the upper electrode and the lower electrode is set properly to conduct the RIE process on the wafer W. Further, the lower electrode includes at its top portion an electrostatic chuck (ESC) for chucking the wafer W, for example, by a coulomb force.

A process gas, such as a fluorine-based gas, bromine-based gas or the like, is introduced into the chamber of the process module 25, and converted into plasma by applying an electric field between the upper electrode and the lower electrode. Accordingly, ions and radicals are generated and used to perform the RIE process on the wafer W, thereby etching, for example, a polysilicon layer of the wafer W.

While the inside of the loader module 13 of the process ship 11 is maintained at atmospheric pressure, the inside of the process module 25 is maintained in a vacuum. Accordingly, the load-lock module 27 includes a vacuum gate valve 29 at a portion that is connected to the process module 25 and an atmospheric gate valve 30 at a portion that is connected to the loader module 13. Thus, the load-lock module 27 is configured as a vacuum preliminary transfer chamber whose inner pressure can be controlled.

The load-lock module 27 includes therein a transfer arm 26, a first buffer 31, and a second buffer 32. The transfer arm 26 is located at a substantially central portion of the load-lock module 27, the first buffer 31 at a portion closer to the process module 25 than the transfer arm 26, and the second buffer 32 at a portion closer to the loader module 13 than the transfer arm 26. The first buffer 31 and the second buffer 32 are arranged on a trajectory along which a pick 33 moves. The pick 33 is located at a leading end portion of the transfer arm 26 to hold the wafer W. By shunting a RIE-treated wafer W temporarily to an upper side of the trajectory of the pick 33, exchange between the RIE-treated wafer W and a wafer W which has not been RIE-treated in the process module 25 can be facilitated.

The substrate processing system 10 further includes a system controller (not shown) and an operation controller 40 that is arranged at a longitudinal end portion of the loader module 13. The system controller controls the operation of the process ship 11, the loader module 13, the orienter 16, and the after-treatment chamber 17 (hereinafter, each referred to as "each component").

The system controller controls the operation of each component according to a recipe, i.e., a program, corresponding to a transfer process of the wafer W, or the RIE process. The operation controller 40 includes a state displaying unit, such as LCD (Liquid Crystal Display), which displays operational conditions of each component.

Figure 2:
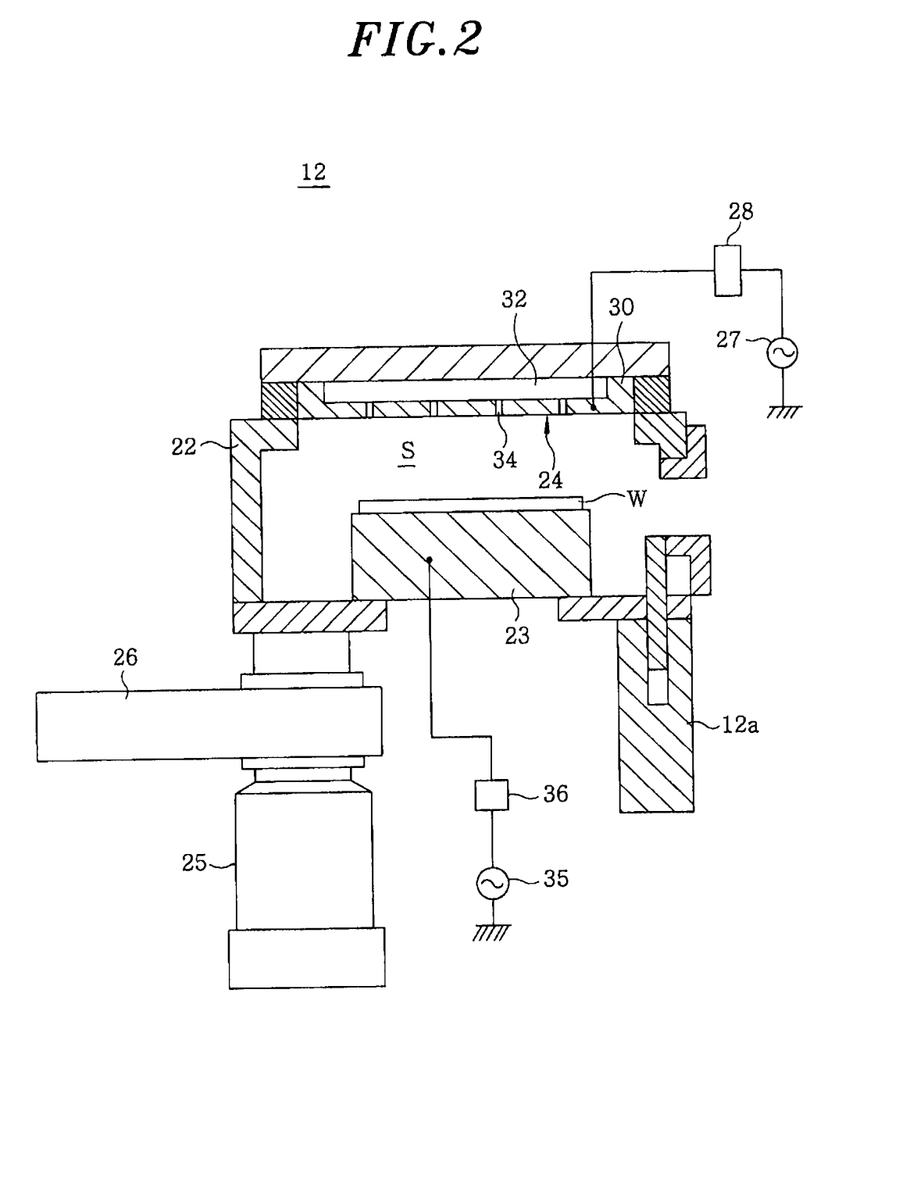
FIG. 2 is a cross sectional view taken along line II-II shown in FIG. 1.

FIG. 2 is a cross sectional view taken along line II-II in FIG. 1.

Referring to FIG. 2, the process module 12 includes the chamber 22, a mounting table 23 for mounting a wafer W thereon, the mounting table 43 being arranged in the chamber 22, a shower head 24 arranged at an upper portion of the chamber 22 to face the mounting table 23 and serving as an upper electrode, a TMP (Turbo Molecular Pump) 25 for exhausting a gas or the like from the chamber 22, an APC (Adaptive Pressure Control) valve 26 as a variable butterfly valve arranged between the chamber 22 and the TMP 25 to control the pressure inside the chamber 22.

A first high-frequency electric power supply 27 is connected to the shower head 24 via a first matcher 28 and a second high-frequency electric power supply 35 is connected to a mounting table 23 via a second matcher 36. The first high-frequency electric power supply 27 applies high-frequency electric power of relatively high-frequency, for example, 60 MHz, to the shower head 24 as excitation electric power and the second high-frequency electric power supply 35 applies high-frequency electric power of relatively low frequency, for example, 2 MHz, to the mounting table 23 as bias electric power. The matchers 28 and 36 reduce reflection of the high-frequency electric power from the shower head 24 and the mounting table 23, respectively, to maximize efficiency of supplying the high-frequency electric power.

The shower head 24 is formed of a disc-shaped gas supply unit 30 that includes a buffer chamber 32. The buffer chamber 32 includes vent holes 34 to communicate with the inside of the chamber 22.

The buffer chamber 32 is connected to gas supply systems (not shown) for supplying CF-based gases. The CF-based gas supply system supplies $CF_4$ gas, $CHF_3$ gas, and $C_4F_8$ gas to the buffer chamber 32. Further, an oxygen-based gas supply system (not shown) supplies $O_2$ gas and COS gas to the chamber 32. $CF_3$ gas, $CHF_3$ gas, and $C_4F_8$ gas, and $O_2$ gas and COS gas are supplied to the chamber 22 via the vent holes 34.

As described above, high-frequency power is applied to the processing space S in the chamber 22 of the process module 12 to convert processing gases supplied from the shower head 24 to the processing space S into high-density plasma, and resultant ions and radicals, by which an etching process is performed on a substrate.

Figure 3:
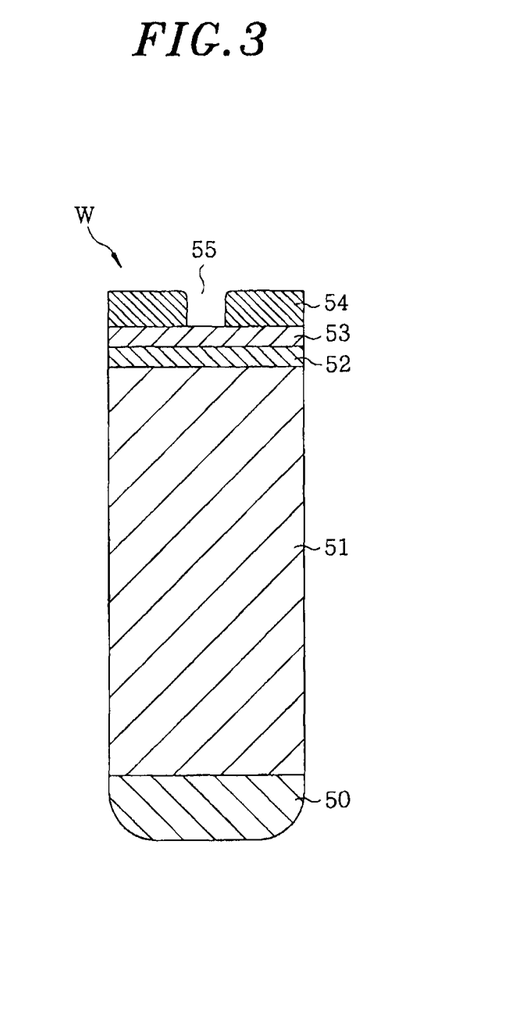
FIG. 3 is a cross section view schematically illustrating a construction of a semiconductor wafer that is subjected to an etching process in the substrate processing system as shown in FIG. 1.

FIG. 3 is a cross section view schematically illustrating a construction of a semiconductor wafer that is subjected to an etching process in the substrate processing system as shown in FIG. 1.

Referring to FIG. 3, the wafer W includes a silicon substrate 50, an oxide layer 51 formed on the surface of the silicon substrate 50, an amorphous carbon layer ("ACL") 52 formed on the oxide layer 51, a bottom antireflective coating ("BARC") layer 53 formed on the ACL 52, and a photoresist layer 54.

The silicon substrate 50 is a thin, disc-shaped plate made of silicon. The oxide layer 51 is formed on the surface of the silicon substrate 50 and the ACL 52 is formed on the oxide layer 51, for example, by performing thermal oxidation on the surface of the silicon substrate 50. The ACL 52 functions as a lower resist layer. The BARC layer 53 is formed on the ACL 52, for example, by a coating process. The BARC layer 53 is made of a high-molecular resin containing a colorant that absorbs a specific wavelength of light, for example, a laser beam emitted from an ArF excimer laser to the photoresist layer 54. The BARC layer 53 prevents a laser beam passing through the photoresist layer 54 from being reflected by the ACL 52 or the oxide layer 51 back to the photoresist layer 54. The photoresist layer 54 is formed on the BARC layer 53, for example, by using a spin coater (not shown). The photoresist layer 54 is made of a positive photosensitive resin and transformed to be alkali-soluble when illuminated with a laser beam from the ArF excimer laser.

In the wafer W as configured above, the photoresist layer 54 is subjected to ArF excimer laser irradiation by a stepper (not shown) to have a predetermined inverted pattern so that part of the photoresist layer 54 irradiated with the laser beam is transformed to be alkali-soluble. Thereafter, a strong alkali developing solution is dropped onto the photoresist layer 54 to remove the transformed part. That is, the part of the photoresist layer 54 corresponding to the inverted pattern is eliminated from the photoresist layer 54 to leave an opening portion 55 at a location where a hole of a predetermined pattern will be formed in the wafer W.

Then, the opening portion 55 is sequentially transcribed to the BARC layer 53, which serves as an anti-reflection layer, and the ACL 52, which serves as a lower resist layer, so that a hole with a predetermined opening portion may be finally formed in the oxide layer 51.

To satisfy recent needs of small semiconductor devices, it is necessary to form in the wafer a good vertical fabricated shaped hole that has even top portion and distortionless bottom portion and does not show a bowing shape. Nowadays, the wafer W has relatively thin intermediate layer and mask layer, and therefore, it is not always easy to form a hole having a good vertical profile and an even top portion in a target layer of the wafer W in the step of etching the wafer W.

The present inventors made various experiments to find out a substrate processing method that forms, in the wafer W including the BARC layer 53 as an intermediate layer and the ACL 52 as a mask layer, a hole with a good vertical profile that has even top portion and distortionless bottom portion and does not show a bowing shape. The present inventors have found the substrate processing method of the present invention in which a CF rich gas is used as a processing gas to perform an etching process on the BARC layer 53 under a relatively high pressure, and then a gas containing a carbonyl sulfide ("COS") gas is used to etch the ACL 52, thereby making it possible to reduce occurrence of striations at the top portion and suppress a distortion at the bottom portion. Further, $C_6F_6$-containing gas is used as a processing gas to etch the oxide layer 51, and thus an amount of remaining mask layer might be maintained. Therefore, a bowing might be suppressed to provide a hole with a good vertical profile.

A substrate processing method according to a first embodiment of the present invention will now be described in detail. This substrate processing method is performed by a system controller included in the substrate processing system 10 according to a substrate processing recipe, a program for processing a substrate in the process modules 12 to 17 of the substrate processing system 10.

The substrate processing method includes a first etching step, a second etching step, and a third (target layer) etching step. In the first etching step, an existing CF-based gas, for example, a mixture gas of $CF_4$ gas, $CHF_3$ gas, and $C_4F_8$ gas, is used to etch the BARC layer 53 serving as an intermediate layer under a high pressure atmosphere, such as 100 mTorr (1.33×10 Pa) to 150 mTorr (2.0×10 Pa). In the second etching step, COS gas is used to etch the ACL 52 serving as a lower resist layer. In the third etching step, a gas containing $C_6F_6$ gas is used to etch the oxide layer 51 as a target layer.

Figure 4:
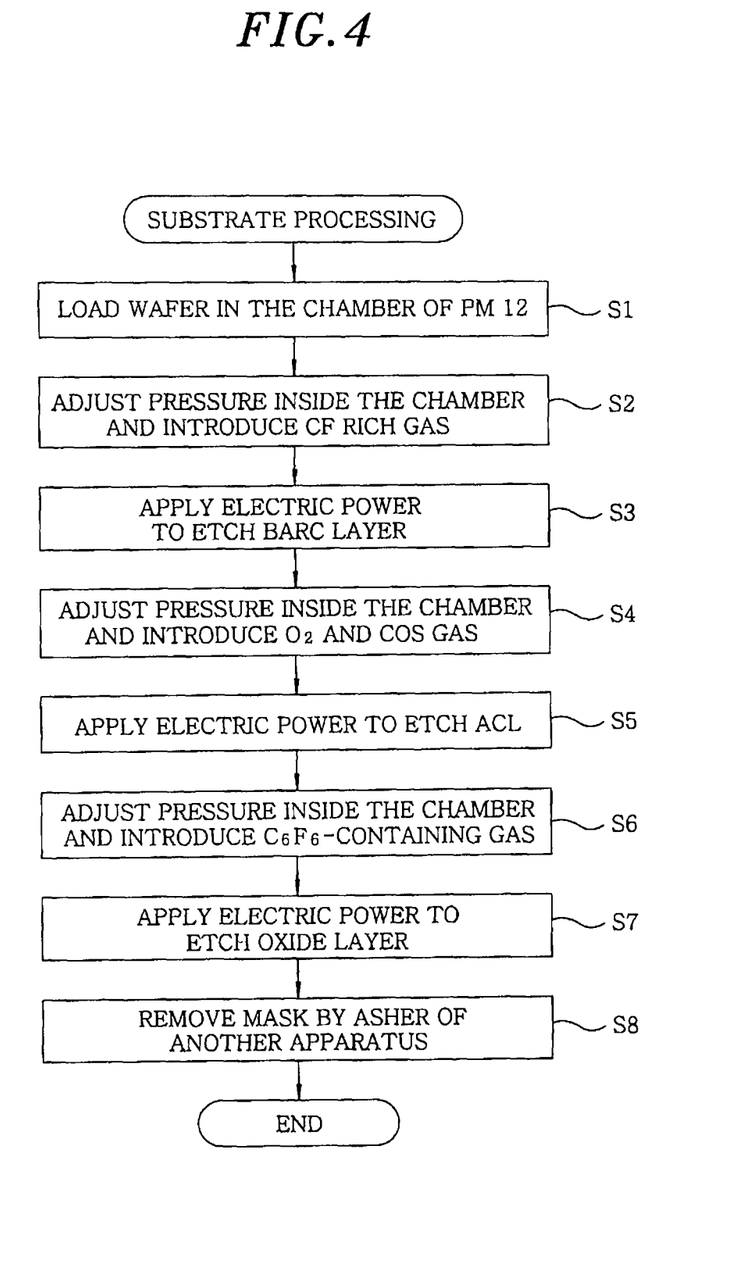
FIG. 4 is a flowchart illustrating substrate processing in the substrate processing method according to the first embodiment of the present invention.

FIG. 4 is a flowchart illustrating substrate processing in the substrate processing method according to the first embodiment of the present invention.

In the substrate processing, the wafer W is first prepared. In the wafer W, the oxide layer 51, the ACL 52, the BARC layer 53, and the photoresist layer 54 are stacked on the silicon substrate 50 in that order. The photoresist layer 54 has the opening portion 55 a the width of, e.g., 70 nm, which partially exposes the BARC layer 53. Then, the wafer W is loaded in the chamber 22 of the process module ("PM") 12 (refer to FIG. 2) and mounted on the mounting table 23 (step S1).

Next, the pressure inside the chamber 22 of the PM 12 is set to, for example 120 mTorr (1.60×10 Pa), by the APC valve 26 or the like and the temperature at the upper portion and the lower portion of the wafer W is set to, for example, 95° c. and 20° c., respectively. And, a mixture gas (CF rich gas) of $CF_4$ of e.g., 220 sccm, $CHF_3$ gas of, e.g., 30 sccm, $C_4F_8$ gas of e.g., 30 sccm, and $O_2$ gas of, e.g., (7+12) sccm is supplied from the gas supply unit 30 of the shower head 24 into the chamber 22 (step S2). And, electric power of 300 W is applied to the upper electrode as excitation electric power and electric power of 300 W is applied to the mounting table 23 as bias electric power. At this time, $CF_4$ gas, $CHF_3$ gas, $C_4F_8$ gas, and $O_2$ gas are excited by the high-frequency electric power applied to the processing space S to be converted into plasma, i.e., ions and/or radicals. The ions and/or radicals collide and react with the surface of the BARC layer 53 or side wall surface of the opening portion, form a deposit on the BARC layer 53, and etch the BARC layer 53 to form an opening portion corresponding to the opening portion 55 of the photoresist layer 54 (step S3). A sufficient amount of deposit is formed on the BARC layer 53 under a deposit-abundant condition based on such a high pressure and CF rich gas, and the BARC layer 53 is etched while maintaining the shape of the opening portion.

After the etching of the BARC layer 53, the pressure inside the chamber is set to, for example 20 mTorr (2.66 Pa), by the APC valve or the like. Further, the temperature of the upper portion and lower portion of the wafer is set to, for example, 95° C. and 20° C., respectively. And, a mixture gas of $O_2$ gas of 750 sccm and COS gas of 30 sccm (flow rate ratio of COS gas to the whole processing gases: 4.0%) is supplied from the gas supply unit 30 of the shower head 24 to the chamber (step S4). And, excitation electric power of 500 W is applied to the shower head 24 serving as an upper electrode and the bias electric power is set to 500 W. $O_2$ gas and COS gas are converted into plasma, i.e., ions and/or radicals by the high-frequency electric power applied to the processing space S. The ions and/or radicals collide and react with the ACL 52 to etch the ACL 52 (step S5).

At this time, it can be seen that a smoothing phenomenon occurs based on the COS gas to avoid expansion of the diameter of the hole at its entrance. The existence of S in the COS gas may be thoughtful as a cause of the above. It is impossible to obtain such an effect of smoothing the shape only with CO gas or $O_2$ gas.

After the etching of the BARC layer 53 and the ACL 52, the pressure inside the chamber is set to, for example, about 20 mTorr (2.66 Pa) by the APC valve. Further, the temperature at the upper portion and lower portion of the wafer W is set to, for example, about 95° C. and 20° C., respectively. And, a mixture gas of $C_6F_6$ gas of e.g., about 12 sccm, $C_4F_6$ gas of e.g., about 25 sccm, $C_4F_8$ gas of e.g., about 20 sccm, Ar gas of e.g., about 200 sccm, and $O_2$ gas of e.g., about 85 sccm is supplied from the gas supply unit 30 of the shower head 24 into the chamber (step S6). And, excitation electric power of about 1100 W is applied to the upper electrode and the bias electric power of about 4500 W is applied to the mounting table 23. $C_6F_6$ gas, $C_4F_6$ gas, $C_4F_8$ gas, Ar gas, and $O_2$ gas are converted into plasma, i.e., ions and/or radicals by the high-frequency electric power applied to the processing space S. The ions and/or radicals collide and react with the oxide layer 51 to etch the oxide layer 51 (step S7).

At this time, a deposit is formed on the ACL 52 based on $C_6F_6$ gas and thus the etching is performed while securing the thickness of the ACL 52 serving as a mask layer. Thus, any bowing shape may be avoided without expansion of side surfaces of the hole, thereby providing a hole having a good vertical profile.

By doing so, the wafer W is formed with a hole that has even top portion and distortionless bottom portion and does not show a bowing shape. Then, the ACL 52 serving as a mask layer is removed from the wafer W by an asher of another apparatus and the process is completed (step S8).

According to this embodiment, the BARC layer 53 is etched by using a CF rich gas containing $CF_4$ gas, $CHF_3$ gas, and $C_4F_8$ gas under a high processing pressure of about 100 mTorr (1.33×10 Pa) to 150 mTorr (2.0×10 Pa). Then, the etching of the ACL 52 is performed by using a COS-containing gas followed by the etching of the oxide layer 51 by using a $C_6F_6$-containing gas. Thus, a necessary amount of deposit can be formed on the respective corresponding mask layers of the oxide layer 51, the ACL 52, the BARC layer 53, and the photoresist layer 54 sequentially stacked on the silicon substrate 50, and thus the etching can be performed while securing a remaining amount of each mask layer, so that a hole with a good vertical profile that has even top portion without any striation and distortionless bottom portion and does not show a bowing shape can be formed in the oxide layer 51.

In this embodiment, the application of CF rich gas and high pressure conditions to the etching of the BARC layer 53 and the application of COS-containing gas to the etching of the ACL 52 raise synergy to suppress occurrence of striations at the top portion of the hole and distortion at the bottom portion. It is necessary in this embodiment to apply a high pressure and a CF rich gas to the etching of the BARC layer 53 and to apply a COS-containing gas to the etching of the ACL 52.

The failure to satisfy either of the two requirements cannot obtain the above-mentioned effects.

It can be thought as below why the hole formed in the oxide layer 51 does not show any striations at its top portion and any distortion at its bottom portion when applying the above 3 conditions. The use of a CF rich gas upon etching the BARC layer 53 allows for an enhanced selectivity with respect to the photoresist layer 54 on the BARC layer 53 on the basis of $CHF_3$ gas or $C_4F_8$ gas, thereby enabling a good shape of hole in the etching of the BARC layer 53. Further, a deposit is easily formed on the photoresist layer 54 based on CF gas, thus enabling etching to be performed while securing a remaining amount of the mask layer and resultantly a thickness of the mask layer. Thus, the shape of the hole in the BARC layer 53 can be stabilized. Further, the etching of the BARC layer 53 is conducted under a high pressure condition of about 100 mTorr ($1.33\times10$ Pa) to 150 mTorr ($2.0\times10$ Pa), so that formation of a deposit is accelerated, thereby improving the effect of stabilizing the hole shape. And, upon etching the ACL 52, a COS-containing gas is used to exert an effect of smoothing the surface of the ACL 52 that raises synergy, so that a hole with an excellent vertical profile can be obtained that has even top portion and distortionless bottom portion.

In this embodiment, upon etching the oxide layer 51, a mixture gas of $C_6F_6$ gas, $C_4F_6$ gas, $C_4F_8$ gas, Ar gas, and $O_2$ gas is used as a processing gas so that a deposit based on $C_6F_6$ gas is easily formed on the ACL 52. Thus, the etching is performed while securing a remaining amount of the ACL 52 as a mask layer. This can prevent a bowing shape from occurring at a hole formed in the oxide layer 51, thus enabling the hole to have an excellent vertical profile. Further, it is thoughtful as a mechanism of causing a bowing shape that in cases where the thickness of a mask layer is not enough, an etcher emitted in an inclined direction with respect to a hole cross section collides with the hole cross section at a relatively large angle to make inner wall surfaces worn out. In cases where the ACL as a mask layer has a sufficient film thickness, the inner wall surfaces are worn but the oxide film is not, so that no bowing shape is shown in the oxide layer.

In this embodiment, the BARC layer 53, the ACL 52, and the oxide layer 51 are all etched in the same PM, and this improve the throughput.

Next, a modification (second embodiment) of the above embodiment will be described.

In the substrate processing method according to the second embodiment, the step of using the $C_6F_6$-containing gas to etch the oxide layer 51 in the first embodiment (the third etching step) is replaced by a fourth etching step including a primary etching step of using a $C_4F_6$-containing gas as a processing gas and a secondary etching step of using a mixture gas of a $C_4F_6$-containing gas and a COS gas as a processing gas. A step of using a mixture gas of $CF_4$ gas, $CHF_3$ gas, and $C_4F_8$ gas to etch the BARC layer 53 (the first etching step) and a step of using a COS gas-containing gas to etch the ACL 52 (the second etching step) are identical to those in the first embodiment.

Hereinafter, descriptions of the second embodiment will generally focus on differences from the first embodiment.

Figure 5:
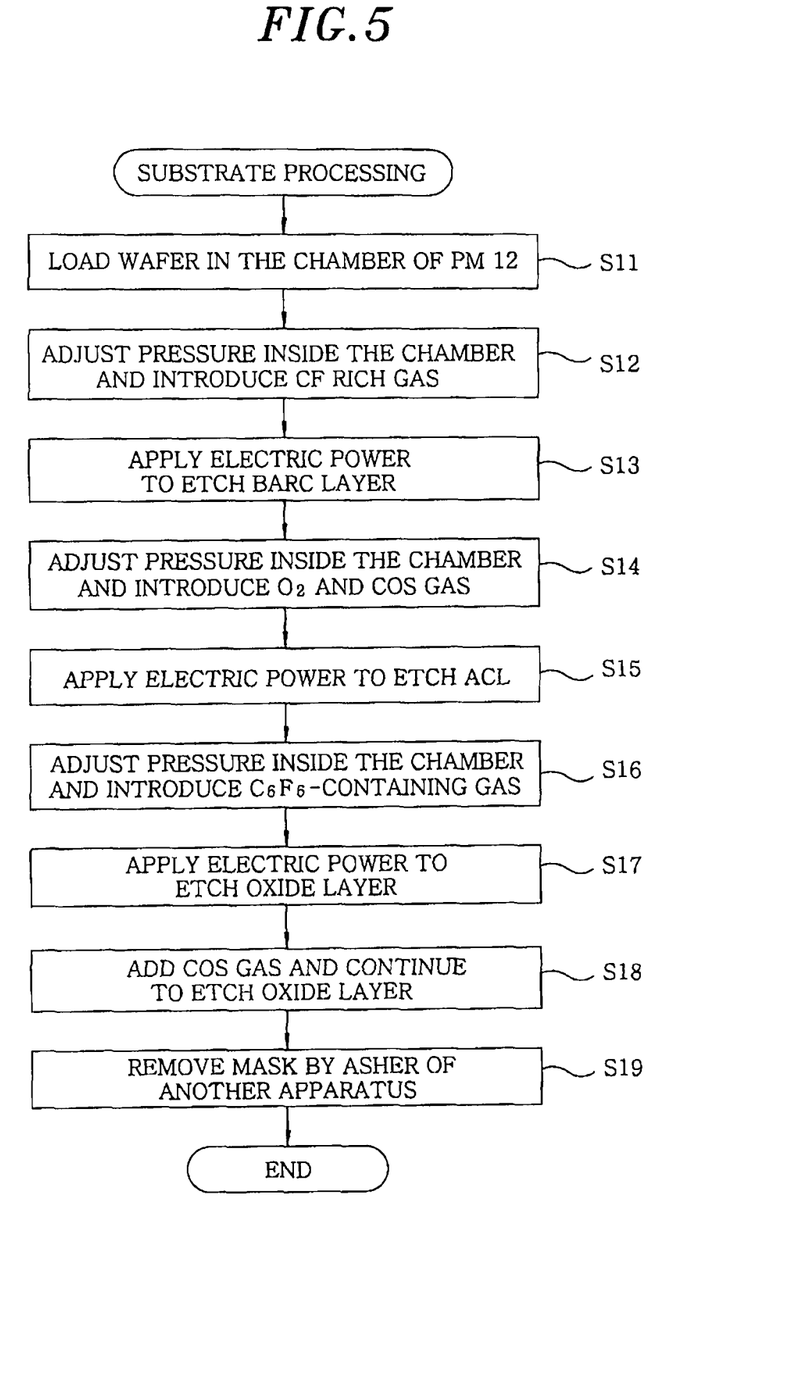
FIG. 5 is a flowchart illustrating processing a substrate in a substrate processing method according to a second embodiment of the present invention.

FIG. 5 is a flowchart illustrating processes in a substrate processing method according to this embodiment, and FIGS. 6A to 6E are diagrams illustrating the substrate processing method according to this embodiment.

Referring to FIG. 5, the wafer W is loaded in the chamber 22 of the PM 12 (step S11), the pressure inside the chamber 22 is adjusted and a CF rich gas is introduced into the chamber (step S12), and excitation electric power and bias electric power are applied to etch the BARC layer 53 (step S13). Next, the pressure inside the chamber 22 is readjusted and $O_2$ gas and COS gas are introduced into the chamber 22 (step S14). Then, electric power as necessary is applied to etch the ACL 52 (step S15). These steps S11 to S15 are similar to steps S1 to S5 in the first embodiment.

Next, the wafer W in which the ACL 52 has been etched is subjected to an etching process so that an opening portion of the ACL 52 is transcribed to the oxide layer 51, for example, a $SiO_2$ layer.

More specifically, the pressure inside the chamber accommodating the wafer W (FIG. 6A) with the etched ACL 52 is set to, for example, about 20 Torr (2.66 Pa) by the APC valve, and temperatures at the upper portion and lower portion of the wafer W are set to, for example, about 60° C. and 40° C., respectively. And, a mixture gas of $C_4F_6$ gas of e.g., about 60 sccm, Ar gas of e.g., about 200 sccm, and $O_2$ gas of about 70 sccm is supplied from the gas supply unit 30 of the shower head 24 into the chamber (step S16). And, excitation electric power of about 500 W and bias electric power of about 4500 W are applied to the upper electrode and the mounting table 23, respectively.

Figure 6A:
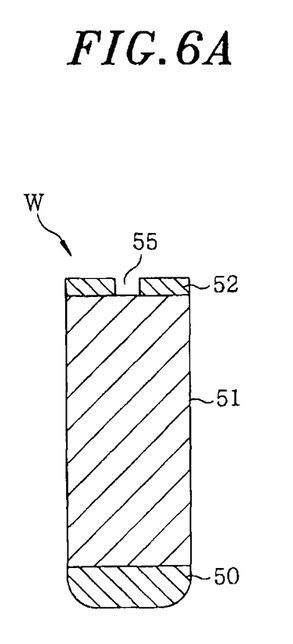
FIGS. 6A to 6E are diagrams illustrating a substrate processing method according to the second embodiment of the present invention.
Figure 6B:
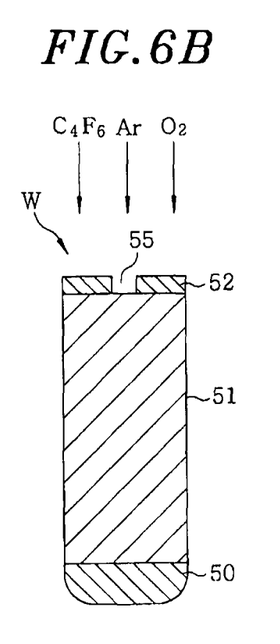
Figure 6C:
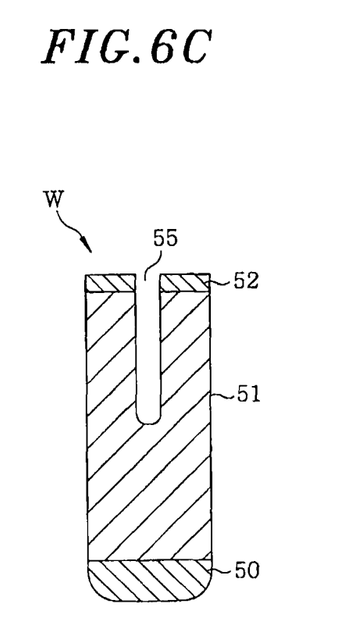

At this time, $C_4F_6$ gas, Ar gas, and $O_2$ gas are converted into plasma by the high-frequency electric power applied to the processing space S, thus generating ions and/or radicals (FIG. 6B). The generated ions and/or radicals collide and react with the ACL 52 and the oxide layer 51 exposed through the opening portion 55 of the ACL 52 to etch them (primary etching step) (step S17). Since the selectivity for the oxide layer 51 is good, the etching is performed with a high etching rate ("ER") to thereby form an opening portion in the oxide layer 51 whose width is correspondent to that of the opening portion of the ACL 52 (FIG. 6C). However, since the oxide layer 51 is considerably thick, keeping etching the oxide layer 51 under these conditions may cause the shape of the hole to be collapsed, thus increasing the CD value.

Figure 6D:
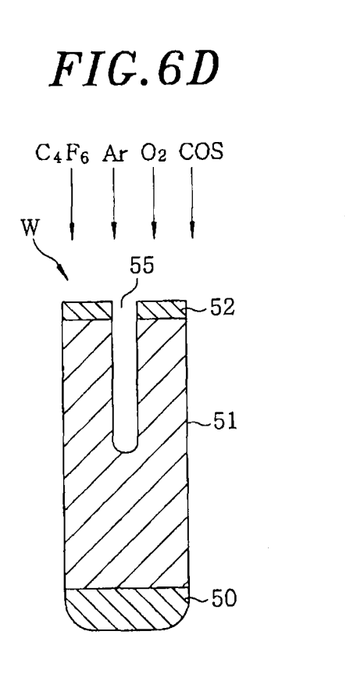
Figure 6E:
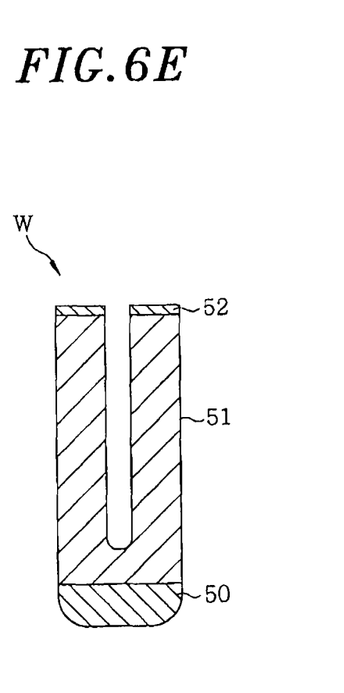

In this embodiment, thus, COS gas is added to the $C_4F_6$-containing gas in the middle of etching of the oxide layer 51 by the $C_4F_6$-containing gas, to generate plasma ions based on a mixture gas of $C_4F_6$-containing gas and COS gas (FIG. 6D). Under this condition, the secondary etching step is performed on the oxide layer 51 to form an opening portion in the oxide layer 51, which has a width corresponding to the width of the opening portion of the ACL 52 (step S18). At this time, a protection film is formed based on $C_4F_6$ gas and COS gas on the top surface of the ACL 52 and side wall surfaces of the opening portion 55. By the protection film, the etching is performed while securing a remaining amount of ACL 52. Accordingly, a bowing shape in which side surfaces of the hole are expanded can be avoided, thus providing a hole having a good vertical profile (FIG. 6E).

By doing so, the wafer W has a hole that has even top portion and distortionless bottom portion and does not show a bowing shape. Then, the ACL 52 is removed from the wafer W by an asher included in another apparatus and the process is completed (step S19).

As described above, this embodiment performs an etching process on the oxide layer 51, as a target layer by the primary etching step that uses as a processing gas the $C_4F_6$-containing gas which is a mixture gas of $C_4F_6$ gas, Ar gas, and $O_2$ gas and the secondary etching step that uses the COS-containing gas which is a mixture gas of the $C_4F_6$-containing gas and COS gas. In the primary etching step, the oxide layer 51 is etched with a high ER to transcribe the opening portion of the ACL 52 to the oxide layer 51. In the secondary etching step, an smoothing effect obtained by the COS gas can prevent collapse of the opening portion at its top portion, increase of CD value, and occurrence of a bowing shape, and avoid reduction of the diameter of the hole at its bottom portion, thus providing a hole having a good vertical profile.

It is not clear how the smoothing effect is obtained which prevents collapse of the top portion of the hole and increase of CD value in the secondary etching step according to this embodiment. However, it is thought that CS and CFS, reaction products of $C_4F_6$ gas and COS gas contained in the processing gas, are attached to side wall surfaces and bottom surface in the shape of a film to serve as a protection film that particularly protects the side wall surfaces against attacks of the ions.

Since a protection film is also formed on the bottom portion of the hole in the secondary etching step according to this embodiment, the selectivity of etching for the oxide layer 51 in the secondary etching step using the COS-containing gas is lowered than the selectivity of etching in the primary etching step that does not use the COS gas. That is, the primary etching step puts its priority on etching and can effectively etch the oxide layer 51 with a high ER to form a hole, but may cause collapse of the hole and increase of CD value. On the other hand, the secondary etching step puts its priority on smoothing and has a lower ER than the primary etching step, but can prevent collapse of the top portion of the hole, increase of CD value, and occurrence of a bowing shape, thus providing a hole having a good vertical profile.

In this embodiment, a timing of changing from the primary etching step to the secondary etching step, i.e., a timing of introducing the COS gas, is important and this is determined by considering as a whole the amount of the remaining ACL 52 (the thickness of the remaining ACL 52) serving as a mask layer, desired CD value, aspect ratio, ER, a time required for etching and the like. Specifically, it is preferably that an experiment of etching an oxide layer under the same conditions as above is made and a timing of introducing the COS gas is determined in advance by which the etching of the oxide layer is completed before the ACL 52 is completely removed. For example, at the time when the amount of remaining ACL 52 reaches about 50% of the initial amount, for example, at the time when the thickness of the ACL 52 becomes about 500 nm, COS gas is added and the primary etching step is properly shifted to the secondary etching step.

In this embodiment, the amount of the COS gas added in the secondary etching step is preferably about 2% to about 5% with respect to the flow rate of the whole processing gases. If the amount of the COS gas added is less than 2%, the diameter of the hole may be increased and if the amount is more than 5%, the etching may stop.

Further, in this embodiment, if the COS gas is added at the beginning of etching the oxide layer 51, the ER of the oxide layer 51 is lowered but the ER of the ACL 52 as a mask layer is not lowered as much as the ER of the oxide layer 51 down to the level. Accordingly, the ACL 52 may disappear before the etching of the oxide layer 51 is completed, thus making it impossible to etch the oxide layer 51.

According to this embodiment, the secondary etching step is employed to avoid increase of the hole CD value in the oxide layer 51. Therefore, an effect obtained upon etching the oxide layer 51 may be previously added to the etching of the BARC layer 53 and the ACL 52 to employ a relatively high ER, thereby shortening the total etching time.

In this embodiment, after the secondary etching step, over-etching is preferably performed under the same conditions as those of the secondary etching step. This may increase CD value of bottom portion of a hole and lessen a difference in CD value between top portion and bottom portion, thus making better the vertical profile of the hole. The time for the OE may amount to, for example, about 10% to 30% of the total etching time for the oxide layer 51. If the OE time is less than 10% of the total etching time, it may be impossible to sufficiently obtain an effect of increasing the CD value of the bottom portion. On the other hand, even though the OE time exceeds 30%, the increasing effect of the bottom portion CD value is not improved as much.

Hereinafter, specific examples of the present invention will be described.

Tables 1 and 2 show dependencies of an effect of improving the shape of a hole on processing pressure, CF rich gas, and COS gas in the step of etching the oxide layer (first etching step) and the step of etching the ACL 52 (second etching step) according to specific examples of the present invention.

TABLE 1

| | Target layer | Pressure | HF/LF | $CF_4$ | $CHF_3$ | $C_4F_8$ | $O_2$ |
|---|---|---|---|---|---|---|---|
| Example 1 | BARC | 100 | 300/300 | 220 | 30 | 30 | 7 + 8 |
| Example 2 | BARC | 120 | 300/300 | 220 | 30 | 30 | 7 + 12 |
| Example 3 | BARC | 150 | 300/300 | 220 | 30 | 30 | 7 + 8 |
| Comparative Example 1 | BARC | 50 | 300/300 | 220 | 30 | 30 | 7 + 8 |
| Comparative Example 2 | BARC | 75 | 300/300 | 220 | 30 | 30 | 7 + 8 |
| Example 4 | BARC | 120 | 300/300 | 220 | 30 | 30 | 7 + 12 |
| Example 5 | BARC | 120 | 300/300 | 220 | 30 | 30 | 7 + 12 |
| Example 6 | BARC | 120 | 300/300 | 220 | 30 | 30 | 7 + 12 |
| Comparative Example 3 | BARC | 120 | 300/300 | 220 | 30 | 30 | 7 + 12 |
| Comparative Example 4 | BARC | 120 | 300/300 | 220 | 30 | 30 | 7 + 12 |
| Comparative Example 5 | BARC | 120 | 300/300 | 150 | *1 | — | — |
| Comparative Example 6 | BARC | 120 | 300/300 | 250 | — | — | — |

Here, "Pressure" refers to a pressure (mTorr) inside the processing chamber, and "HF" and "LF" refer to excitation electric power (W) applied to the upper electrode and bias electric power (W) applied to the mounting table, respectively. "$CF_4$", "$CHF_3$", "$C_4F_8$", and "$O_2$" refer to flow rates (unit: sccm) of the corresponding gases. In the item "$O_2$", "7+8" and "7+12" refer to "the amount of $O_2$ gas introduced at a central portion + the amount of $O_2$ gas introduced at a peripheral portion", respectively. Further, "*1" means that the processing gas includes Ar gas of 150 sccm.

TABLE 2

| | Target layer | Pressure | HF/LF | $O_2$ | COS | Shape effect |
|---|---|---|---|---|---|---|
| Example 1 | ACL | 20 | 500/500 | 750 | 30 | ○ |
| Example 2 | ACL | 20 | 500/500 | 750 | 30 | ◎ |
| Example 3 | ACL | 20 | 500/500 | 750 | 30 | ◎ |
| Comparative Example 1 | ACL | 20 | 500/500 | 1125 | 9 | X |
| Comparative Example 2 | ACL | 20 | 500/500 | 750 | 30 | X |
| Example 4 | ACL | 20 | 500/500 | 600 | 30(5.0%) | ◎ |
| Example 5 | ACL | 20 | 500/500 | 750 | 30(4.0%) | ◎ |
| Example 6 | ACL | 20 | 500/500 | 900 | 30(3.3%) | ◎ |
| Comparative Example 3 | ACL | 20 | 500/500 | 600 | 0 | X |
| Comparative Example 4 | ACL | 20 | 500/500 | 600 | 60(10%) | Δ |
| Comparative Example 5 | ACL | 20 | 500/500 | 750 | 30 | X |
| Comparative Example 6 | ACL | 20 | 500/500 | 750 | 30 | X |

Here, "Pressure" refers to a pressure (mTorr) inside the processing chamber, and "HF" and "LF" refer to excitation electric power (W) applied to the upper electrode and bias electric power (W) applied to the mounting table, respectively. "$O_2$" and "COS" refer to flow rates (sccm) of the corresponding gases. In the item "COS", the number in parentheses refers to a percentage of a flow rate of COS gas to that of the whole processing gases. "Shape effect" refers to a result of having observed a top portion and a cross section of a hole formed in the ACL 52. "⊚" refers to a case where a high enhanced effect was obtained, "O" a case where there was obtained as much effect as being not problematic in practical terms, "Δ" a case where there was an effect but not sufficient, and "x" a case where there was no enhanced effect and this may cause a problem in practical terms. The results in Tables 1 and 2 were obtained by consecutively performing a series of processes, which are represented in the same Examples and Comparative Examples.

In Tables 1 and 2, Examples 1 to 3 and Comparative Examples 1 and 2 refer to a dependency of the etching of the BARC layer 53 on processing pressure. In Examples 1 to 3, since the processing pressure satisfies a range according to the present invention, i.e., 100 mTorr (1.33×10 Pa) to 150 mTorr (2.0×10 Pa), an effect of improving the shape of a hole was obtained, that is, the hole obtained did not show any striations at its top portion and any distortion at its bottom portion. In Examples 1 to 3, the processing pressure for etching the BARC film was particularly preferable in the range from 120 mTorr (1.6×10 Pa) to 150 mTorr (2.0×10 Pa). In Comparative Examples 1 and 2, meanwhile, the processing pressure for etching the BARC layer 53 failed to satisfy the range according to the present invention, and there was no effect of improving the shape of a hole, that is, the hole obtained showed some striations at its top portion.

Examples 4 to 6 and Comparative Examples 3 and 4 refer to a dependency of the etching of the ACL 52 on the COS gas. In Examples 4 to 6 and Comparative Example 4, since the COS-containing gas was used as a processing gas, an effect of improving the shape of a hole was obtained. In a case where the flow rate of the COS gas reaches 3% to 5% of the flow rate of the whole processing gases, an excellent shape enhancing effect was achieved, that is, there was formed a hole whose top portion is even and bottom portion does not have any distortion. In contrast, it could be seen through Comparative Example 4 in which the flow rate of COS gas amounts to 10% of the flow rate of the whole processing gases that any shape enhancing effect was not sufficiently obtained and some distortion appeared at the bottom portion of the hole. Accordingly, it can be seen from the above that the percentage of the flow rate of COS gas to the whole processing gases is particularly preferably in the range from 3% to 5%. On the other hand, in Comparative Example 3, since no COS gas was used, the hole had an uneven circular shape viewed from the top, and no shape enhancing effect was obtained.

Comparative Examples 5 and 6 refer to cases where CF rich gas is not used as the processing gas in the etching of the BARC layer. Comparative Examples 5 and 6 are compared with Example 2. More specifically, Comparative Example 5 used Ar gas instead of $CHF_3$ gas and $C_4F_8$ gas unlike Example 2. Comparative Example 6 shows a case where $CF_4$ only was used without $CHF_3$ gas and $C_4F_8$ gas unlike Example 2. Since Comparative Examples 5 and 6 did not use CF rich gas in the etching of the BARC layer 53, no shape enhancing effect was achieved. Here, the "CF rich gas" means a gas containing $CHF_3$ gas and $C_4F_8$ gas, as well as $CF_4$.

Next, there will be described dependency of a hole shape enhancing effect on $C_6F_6$ gas in the step of etching the oxide layer 51 (third etching step) following the step of etching the BARC layer 53 (first etching step) and the step of etching the ACL 52 (second etching step).

Table 3 shows a dependency of hole shape enhancing effect on $C_6F_6$ gas in the third etching step following the first etching step and the second etching step that were performed in Example 2 as shown in Tables 1 and 2.

TABLE 3

|  | Target layer | $C_6F_6$ | $C_4F_6$ | $C_4F_8$ | Ar | $O_2$ | Remaining ACL layer | Hole width | Shape determination |
|---|---|---|---|---|---|---|---|---|---|
| Example 7 | Oxide layer | 8(2.4%) | 45 | — | 200 | 85 | ⊚ | ⊚ | O |
| Example 8 | Oxide layer | 8(2.4%) | 25 | 20 | 200 | 85 | O | ⊚ | O |
| Example 9 | Oxide layer | 12(3.5%) | 25 | 20 | 200 | 85 | ⊚ | ⊚ | ⊚ |
| Example 10 | Oxide layer | 16(4.6%) | 25 | 20 | 200 | 85 | ⊚ | O | O |
| Comparative Example 7 | Oxide layer | 0 | 45 | — | 200 | 85 | O | X | X |

In each Example and Comparative Example, the processing pressure was 20 mTorr (2.66 Pa), and excitation electric power applied to the upper electrode and bias electric power applied to the mounting table were 1100 W and 4500 W, respectively. "$C_6F_6$", "$C_4F_6$", "$C_4F_8$", "Ar", and "$O_2$" refer to the flow rates of the corresponding gases (unit: sccm). The number in parentheses in the item "$C_6F_6$" refers to percentage of the flow rate of $C_6F_6$ to the flow rate of the whole gases. "Shape determination" (anti-bowing effect) is made as the shape of hole width (hole width) and the amount of remaining ACL layer (remaining ACL layer), wherein "⊚" means a large anti-bowing effect, "O" an anti-bowing effect as sufficiently exhibited, "Δ" an anti-bowing effect as insufficiently exhibited, and "x" no anti-bowing effect.

In Table 3, since Examples 7 to 10 used $C_6F_6$ gas in the etching of the oxide layer 51, a deposit was formed on the ACL 52 serving as a mask layer, and thus the etching was performed while securing a thickness of the mask layer. Accordingly, the cross section shape of the hole was stabilized in comparison with that of Comparative Example 7 and an anti-bowing effect was exhibited. Further, it could be seen that a necking position where the opening portion of the oxide layer 51 has the largest cross section might be raised up, thereby exhibiting an anti-bowing effect. The percentage of the flow rate of $C_6F_6$ to the flow rate of the whole processing gases is preferably, 2% or more, particularly in the range of 2% to 5%. In Comparative Example 7, $C_6F_6$ gas was not used in the etching of the oxide layer 51, and thus, when the amount of remaining ACL layer 52 is large, the hole width becomes narrowed. In this case, if the hole width is expanded, an amount of remaining ACL layer cannot be secured, thus making it impossible to achieve a bowingless shape.

In Example 8, $C_4F_6$ gas was partially replaced by $C_4F_8$ gas unlike Example 7. However, it can be seen that addition of $C_4F_8$ gas allows for expansion of the hole width. By partially replacing $C_4F_6$ gas by $C_4F_8$ gas, the hole width may be expanded while securing an amount of remaining ACL layer, thus preventing occurrence of a bowing shape. That is, in this embodiment, the $C_6F_6$-containing gas used as a processing gas for etching the oxide layer 51 contains $C_4F_6$, as well as $C_6F_6$, and is preferable to include $C_4F_8$ as well. It can be thought that by containing $C_4F_8$, selectivity in the etching of the oxide layer may be slightly lowered, so that side walls of the hole are some what cut off to expand the hole width. Further, a sufficient selectivity can be obtained by $C_6F_6$ gas and thus it does not matter to slightly reduce the selectivity by $C_4F_8$ gas.

Table 4 shows a difference in hole shape between Examples, in which case a primary etching step is followed by a secondary etching step, and Comparative Examples, in which case the secondary etching step is not performed, in the oxide layer etching step.

TABLE 4

|  | Primary etching step (sec) | Secondary etching step (sec) | Top CD (nm) | Bottom CD (nm) |
| --- | --- | --- | --- | --- |
| Example 11 | 210 | 210 | 115 | 71 |
| Example 12 | 210 | 269 | 115 | 81 |
| Example 13 | 210 | 328 | 117 | 86 |
| Comparative Example 8 | 360 | — | 136 | 95 |
| Comparative Example 9 | 396 | — | 135 | 89 |
| Comparative Example 10 | 432 | — | 133 | 94 |

In Examples 11 to 13 of Table 4, the primary etching was conducted on the wafer W, in which the ACL 52 had been etched to have its CD value in the range of 95 to 110 nm, under the pressure inside the chamber of 20 mTorr (2.66 Pa) by using as the processing gas a mixture gas of $C_4F_6$ gas of 60 sccm, Ar gas of 200 sccm, and $O_2$ gas of 70 sccm. At this time, the excitation electric power and bias electric power were 500 W and 4500 W, respectively, and the etching time was 210 sec. Then, the secondary etching that was performed using a mixture gas obtained by adding COS gas of 10 sccm to the mixture gas used for the primary etching step. Here, the etching times of the secondary etching step for Examples 11 to 13 were 210 sec, 269 sec, and 328 sec, respectively. "Top CD" and "Bottom CD" refer to values of having measured top CDs and bottom CDs after each experiment, i.e., after the secondary etching step. The top CD value when the primary etching step was ended was 120 nm.

In Comparative Examples 8 to 10, the same wafer W as that used in Examples 11 to 13 was used, and the primary etching step in Examples 11 to 13 was only carried out for the etching times of 360 sec, 396 sec, and 432 sec, respectively. "Top CD" and "Bottom CD" refer to values of having measured top CDs and bottom CDs after each experiment.

It could be seen in Table 4 that, in Examples 11 to 13 performing the secondary etching step, top CD values after the experiment were 115 nm, 115 nm, and 117 nm, respectively, and in comparison with the top CD values when the primary etching step was ended, the CD values were not increased. In contrast, it could be seen that, in Comparative Examples 8 to 10, the top CD values after the experiment were 136 nm, 135 nm, and 133 nm, respectively, and in comparison with the top CD values when the primary etching step was ended in Examples 11 to 13, the CD values were increased. These results show that it is possible to etch the oxide layer 51 while preventing the increase of top CD values by performing the secondary etching step using a COS-containing gas following the primary etching step.

Figure 7:
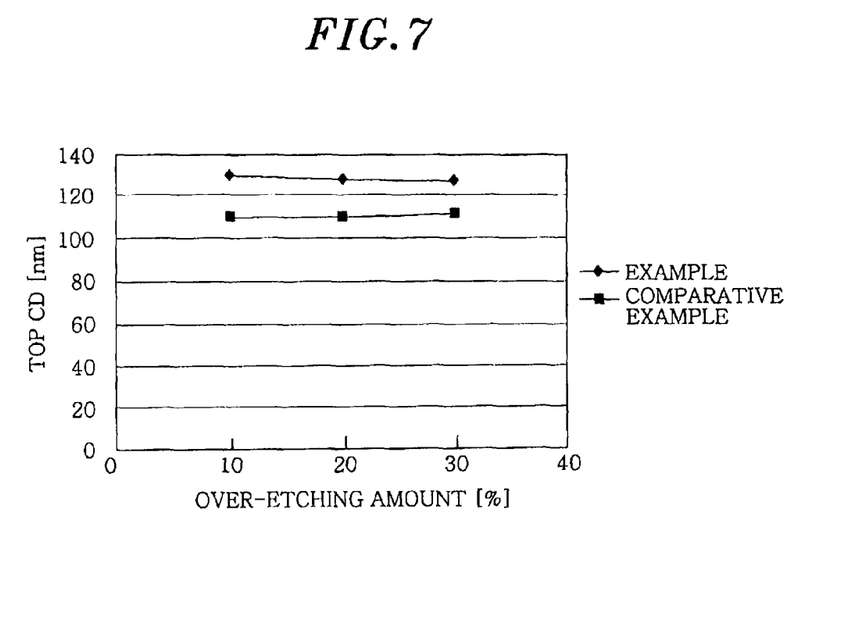
FIG. 7 is a graph illustrating a variation of top CD values respective of the amount of over-etching when OE is performed in examples and comparative examples.

Next, a specific example of over-etching will be described. FIG. 7 is a graph illustrating a variation of top CD values with respect to the amount of over-etching when the OE is performed in Examples 11 to 13 and Comparative Examples 8 to 10, and FIG. 8 is a graph illustrating a variation of bottom CD values respective of the amount of over-etching when the OE is performed in Examples 11 to 13 and Comparative Examples 8 to 10.

Here, the OE in Examples 11 to 13 was performed for 10% to 30% of the total etching time for the oxide layer 51 under the same conditions as the secondary etching step after the secondary etching step had been completed in Examples 11 to 13, and the OE in Comparative Examples 8 to 10 was performed for 10% to 30% of the total etching time for the oxide layer 51 under the same condition as the etching step (primary etching step) after the etching step (primary etching step) had been completed in Comparative Examples 8 to 10.

Figure 8:
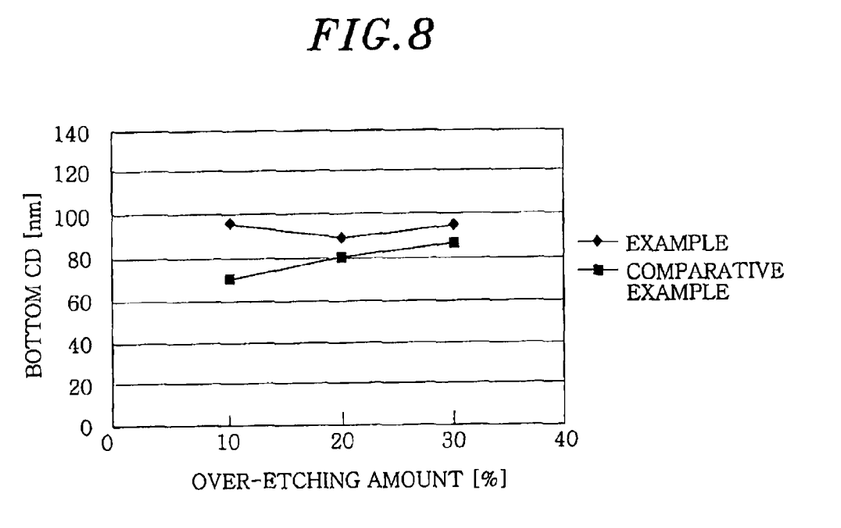
FIG. 8 is a graph illustrating a variation of bottom CD values respective of the amount of over-etching when OE is performed in examples and comparative examples.

As can be seen in FIGS. 7 and 8, in the Comparative Examples using no COS-containing gas, neither the top CD values nor bottom CD values were nearly varied even though the amount of OE was increased. In the Examples performing the secondary etching step using a COS-containing gas, however, as the amount of OE increased, the top CD values were not nearly varied but the bottom CD values were gradually increased. From these points of view, it could be concluded that if a secondary etching step is performed by using a COS-containing gas and then OE is performed under the same conditions as the secondary etching step, bottom CD values can be increased while preventing top CD values from being increased, and further, adjustment of OE times enables adjustment of the degree of increase of the bottom CD values.

In the aforementioned embodiments of the present invention, the substrate to be plasma-processed is not limited to a wafer for semiconductor devices, but may include various substrates used for LCDs (Liquid Crystal Displays), FPD (Flat Panel Displays) or so, or photomasks, CD substrates, print substrates or the like.

Moreover, the object of the present invention may be also achieved by a storage medium storing program codes of software for implementing the functions of the above-mentioned embodiments, which is supplied to a system or device whose computer (or CPU or MPU) may read and execute the program codes stored in the storage medium.

In this case, the program codes themselves, which are read from the storage medium, realize the functions of the above-described embodiments, and the program codes and the storage medium storing the program codes configure the present invention.

Further, the storage medium for supplying program codes may include, for example, floppy discs (registered trademark), hard discs, magneto-optical discs, optical discs, such as CD-ROM, CD-R, CD-RW, DVD-ROM, DVD-RAM, DVD-RW, and DVD+RW, magnetic tapes, non-volatile memory cards, and ROMs. Or, the program codes may be downloaded over a network.

The functions of each of the above-described embodiments may be implemented by executing the program codes read by the computer, or by actual processes a part or all of which is executed by OS (Operating System) operating in the computer based on commands of the program codes.

The program codes read from the storage medium may be recorded in a memory provided in a function extension board inserted in the computer or a function extension unit connected to the computer. The functions of the above-described embodiments may be implemented by actual processes a part or all of which is executed by a CPU provided in the extension board or extension unit based on commands of the program codes.

While the invention has been shown and described with respect to the embodiments, it will be understood by those skilled in the art that various changes and modification may be made without departing from the scope of the invention as defined in the following claims.

What is claimed is:

1. A substrate processing method of etching a substrate including a target layer, and a mask layer and an intermediate layer that are stacked on the target layer, to form a pattern on the target layer via the intermediate layer and the mask layer, the method comprising:
   etching the intermediate layer under a processing chamber pressure of about 100 mTorr ($1.33 \times 10$ Pa) to 150 mTorr ($2.0 \times 10$ Pa) by using a first processing gas which is a gaseous mixture including $CF_4$ gas, $CHF_3$ gas, and $C_4F_8$ gas; and
   etching the mask layer by using a second processing gas including a carbonyl sulfide (COS) gas,
   wherein the intermediate layer is made of a high-molecular resin and the mask layer is an amorphous carbon layer.

2. The substrate processing method of claim 1, wherein in said etching the mask layer, the flow rate of the COS gas is set to be about 3% to 5% of the flow rate of the whole processing gases.

3. The substrate processing method of claim 1, wherein in said etching the mask layer, the processing chamber pressure is set to be about 20 mTorr (2.66 Pa) or less.

4. A substrate processing method of etching a substrate including a target layer, and a mask layer and an intermediate layer that are stacked on the target layer, to form a pattern on the target layer via the intermediate layer and the mask layer, the method comprising:
   etching the target layer by using a processing gas including a $C_6F_6$ gas and at least one of an Ar gas and an $O_2$ gas, wherein the processing gas as a whole flows at a first flow rate and the $C_6F_6$ gas flows at a second flow rate,
   wherein the intermediate layer is made of a high-molecular resin, the mask layer is an amorphous carbon layer, and the target layer is a silicon oxide layer,
   wherein in said etching the target layer, a ratio of the second flow rate to the first flow rate is set such that the amorphous carbon layer at least partially remains when said etching the target layer is finished and bowing is suppressed in the etched target layer.

5. The substrate processing method of claim 4, wherein in said etching the target layer, the processing chamber pressure is set to about 20 mTorr (2.66 Pa) or less.

6. The substrate processing method of claim 4, wherein the processing gas includes the $C_6F_6$ gas, the Ar gas, the $O_2$ gas, and a $C_4F_6$ gas.

7. The substrate processing method of claim 6, wherein the second flow rate is about 3.5% of the first flow rate.

8. The substrate processing method of claim 6, wherein in said etching the target layer, the second flow rate is set to be about 2% or more of the first flow rate.

9. The substrate processing method of claim 8, wherein the processing gas further includes a $C_4F_8$ gas.

10. The substrate processing method of claim 8, wherein in said etching the target layer, the second flow rate is set to be 2% to 5% of the first flow rate.

11. A substrate processing method of etching a substrate including a target layer, and a mask layer and an intermediate layer that are stacked on the target layer, to form a pattern on the target layer via the intermediate layer and the mask layer, the method comprising:
   etching the target layer, said etching including:
      a primary etching using a processing gas including a $C_4F_6$ gas, and
      a secondary etching using a gas mixture including $C_4F_6$ gas and a carbonyl sulfide (COS) gas,
   wherein the primary etching is performed without supplying the COS gas, and
   wherein the mask layer is an amorphous carbon layer and the target layer is a $SiO_2$ layer.

12. The substrate processing method of claim 11, wherein in said etching the target layer, the secondary etching is extended by a predetermined time to perform over-etching.

13. The substrate processing method of claim 12, wherein the predetermined time amounts to about 10% to 30% of a total etching time for the target layer.

14. The substrate processing method of claim 11, wherein in said etching the target layer, in the secondary etching, the flow rate of the COS gas is set to be about 2% to 5% of the flow rate of the whole processing gases.

15. The substrate processing method of claim 14, wherein in said etching the target layer, the secondary etching is extended by a predetermined time to perform over-etching.

16. The substrate processing method of claim 15, wherein the predetermined time amounts to about 10% to 30% of a total etching time for the target layer.

17. A substrate processing method of etching a substrate including a target layer, and a mask layer and an intermediate layer that are stacked on the target layer, to form a pattern on the target layer via the intermediate layer and the mask layer, the method comprising:
   etching the intermediate layer under a processing chamber pressure of about 100 mTorr ($1.33 \times 10$ Pa) to 150 mTorr ($2.0 \times 10$ Pa) by using a first processing gas which is a gaseous mixture including $CF_4$ gas, $CHF_3$ gas, and $C_4F_8$ gas;
   etching the mask layer by using a second processing gas including a carbonyl sulfide (COS) gas; and
   etching the target layer by using a third processing gas including a $C_6F_6$ gas and an $O_2$ gas.

18. The substrate processing method of claim 17, wherein in said etching the mask layer, the flow rate of the COS gas is set to be about 3% to 5% of the flow rate of the whole processing gases.

19. The substrate processing method of claim 17, wherein in said etching the mask layer, the processing chamber pressure is set to be about 20 mTorr (2.66 Pa) or less.

20. The substrate processing method of claim 17, wherein in said etching the target layer, the processing chamber pressure is set to about 20 mTorr (2.66 Pa) or less.

21. The substrate processing method of claim 17, wherein the intermediate layer is an antireflective coating layer made of a high-molecular resin,
   the mask layer is an amorphous carbon layer, and
   the target layer is a $SiO_2$ layer.

22. The substrate processing method of claim 17, wherein in said etching the target layer, the third processing gas further includes a $C_4F_6$ gas and an Ar gas, and the flow rate of the $C_6F_6$ gas in the third processing gas is set to be about 2% or more of the flow rate of the whole processing gases.

23. The substrate processing method of claim 22, wherein the third processing gas further includes a $C_4F_8$ gas.

24. A substrate processing method of etching a substrate including a target layer, and a mask layer and an intermediate layer that are stacked on the target layer, to form a pattern on the target layer via the intermediate layer and the mask layer, the method comprising:
- etching the intermediate layer under a processing chamber pressure of about 100 mTorr (1.33×10 Pa) to 150 mTorr (2.0×10 Pa) by using a first processing gas which is a gaseous mixture including $CF_4$, $CHF_3$, and $C_4F_8$;
- etching the mask layer by using a second processing gas including a carbonyl sulfide (COS) gas; and
- etching the target layer, which includes:
  - a primary etching using a third processing gas including a $C_4F_6$; and
  - a secondary etching using a mixture gas including $C_4F_6$ gas and a COS gas,
- wherein the primary etching is performed without supplying the COS gas, and
- wherein the mask layer is an amorphous carbon layer and the target layer is a $SiO_2$ layer.

25. The substrate processing method of claim 24, wherein in said etching the mask layer, the flow rate of the COS gas is set to be about 3% to 5% of the flow rate of the whole processing gases.

26. The substrate processing method of claim 24, wherein in said etching the mask layer, the processing chamber pressure is set to be about 20 mTorr (2.66 Pa) or less.

27. The substrate processing method of claim 24, wherein in said etching the target layer, the secondary etching is extended by a predetermined time to perform over-etching.

28. The substrate processing method of claim 24, wherein the intermediate layer is etched under a processing chamber pressure of about 120 mTorr to 150 mTorr.

29. The substrate processing method of claim 24, wherein the intermediate layer is an antireflective coating layer made of a high-molecular resin.

30. The substrate processing method of claim 24, wherein in said etching the target layer, in the secondary etching, the flow rate of the COS gas is set to be about 2% to 5% of the flow rate of the whole processing gases.

31. The substrate processing method of claim 30, wherein in said etching the target layer, the secondary etching is extended by a predetermined time to perform over-etching.

32. The substrate processing method of claim 31, wherein the predetermined time amounts to about 10% to 30% of a total etching time for the target layer.

33. The substrate processing method of claim 32, wherein the predetermined time amounts to about 10% to 30% of a total etching time for the target layer.

* * * * *